US008818742B2

(12) United States Patent
Ansari

(10) Patent No.: US 8,818,742 B2
(45) Date of Patent: Aug. 26, 2014

(54) SYSTEMS, METHODS, AND APPARATUS FOR DETECTING THEFT AND STATUS OF ELECTRICAL POWER

(75) Inventor: Adil Ansari, Atlanta, GA (US)

(73) Assignee: General Electric Company, Schenectady, NY (US)

(*) Notice: Subject to any disclaimer, the term of this patent is extended or adjusted under 35 U.S.C. 154(b) by 598 days.

(21) Appl. No.: 13/071,748

(22) Filed: Mar. 25, 2011

(65) Prior Publication Data
US 2012/0245869 A1 Sep. 27, 2012

(51) Int. Cl.
G01R 21/06 (2006.01)
G01R 22/06 (2006.01)
G01R 11/24 (2006.01)
G01R 19/25 (2006.01)
G01R 31/40 (2014.01)

(52) U.S. Cl.
CPC .............. G01R 22/066 (2013.01); G01R 11/24 (2013.01); G01R 19/2513 (2013.01); G01R 31/40 (2013.01)
USPC .............. 702/61; 702/62; 702/64; 324/76.11; 324/110; 700/291; 700/293

(58) Field of Classification Search
CPC .. G01R 11/24; G01R 22/066; G01R 19/2513; G01R 31/40
USPC ...................... 702/61, 62, 64; 324/76.11, 110; 700/291, 293
See application file for complete search history.

(56) References Cited

U.S. PATENT DOCUMENTS

| 4,727,315 | A | 2/1988 | Jones | |
|---|---|---|---|---|
| 5,488,565 | A | 1/1996 | Kennon et al. | |
| 5,736,877 | A * | 4/1998 | Tihanyi | 327/77 |
| 5,940,009 | A | 8/1999 | Loy et al. | |
| 6,141,197 | A | 10/2000 | Kim et al. | |
| 6,292,717 | B1 | 9/2001 | Alexander et al. | |
| 6,429,643 | B1 * | 8/2002 | Smith | 324/142 |
| 2008/0204953 | A1 | 8/2008 | Shuey | |
| 2009/0079416 | A1 * | 3/2009 | Vinden et al. | 324/103 R |
| 2009/0187285 | A1 * | 7/2009 | Yaney et al. | 700/292 |
| 2009/0261805 | A1 | 10/2009 | Shuey | |
| 2011/0068819 | A1 * | 3/2011 | Sims et al. | 324/764.01 |
| 2011/0098867 | A1 * | 4/2011 | Jonsson et al. | 700/295 |
| 2011/0118890 | A1 * | 5/2011 | Parsons | 700/295 |

FOREIGN PATENT DOCUMENTS

FR 2 947 055 A1 12/2010
GB 2 313 201 A 11/1997

OTHER PUBLICATIONS

Search Report issued in connection with EP Application No. 12161113.1, Jul. 18, 2012.

* cited by examiner

Primary Examiner — Sujoy Kundu
Assistant Examiner — Paul D Lee
(74) Attorney, Agent, or Firm — Sutherland Asbill & Brennan LLP

(57) ABSTRACT

Certain embodiments of the invention may include systems, methods, and apparatus for detecting theft and status of electrical power. According to an example embodiment of the invention, a method is provided for detecting theft and status of electrical power. The method can include monitoring switch state of a main circuit breaker, monitoring load-side voltage, monitoring load current, determining one or more conditions associated with power usage based at least in part on one or more of the monitored switch state, the monitored load-side voltage, or the monitored load current and transmitting information representing the one or more determined conditions.

17 Claims, 4 Drawing Sheets

300

| Circuit Breaker | Load Current | Load Voltage | Condition  (301) |
|---|---|---|---|
| 0 | 0 | 0 | Load Isolated |
| 0 | 0 | 1 | Theft or renewable power |
| 0 | 1 | 0 | Invalid state |
| 0 | 1 | 1 | Invalid state |
| 1 | 0 | 0 | Load isolated/power outage |
| 1 | 0 | 1 | Load isolated |
| 1 | 1 | 0 | invalid state |
| 1 | 1 | 1 | normal operation |

302

| | Key | |
|---|---|---|
| Circuit breaker | 0 = open | 1 = closed |
| Load current | 0 = house load < min current | 1 = house load > min current |
| Load voltage | 0 = line voltage < min voltage | 1 = house load > min voltage |

FIG. 3

SYSTEMS, METHODS, AND APPARATUS FOR DETECTING THEFT AND STATUS OF ELECTRICAL POWER

FIELD OF THE INVENTION

This invention generally relates to smart circuit breakers, and in particular, to detecting theft and status of electrical power.

BACKGROUND OF THE INVENTION

Electrical power theft is becoming a common problem for electrical companies, resulting in a significant loss of revenue. Power can be stolen by accessing power lines and bypassing electric meters. A need remains for improved systems, methods, and apparatus for detecting theft and status of electrical power.

BRIEF SUMMARY OF THE INVENTION

Some or all of the above needs may be addressed by certain embodiments of the invention. Certain embodiments of the invention may include systems, methods, and apparatus for detecting theft and status of electrical power.

According to an example embodiment of the invention, a method is provided for detecting theft and status of electrical power. The method can include monitoring the switch state of a main circuit breaker, monitoring the load-side voltage, monitoring the load current; determining one or more conditions associated with power usage based at least in part on one or more of the monitored switch state, the monitored load-side voltage, or the monitored load current; and transmitting information representing the one or more determined conditions.

According to another example embodiment, a system is provided for detecting theft and status of electrical power. The system includes a power meter, a main circuit breaker, one or more sensors for monitoring the switch state of the main circuit breaker, a voltage monitoring circuit for monitoring the load-side voltage, and a current monitoring circuit for monitoring the load current. The system also includes a controller configured for determining one or more conditions associated with power usage based at least in part on one or more of the monitored switch state, the monitored load-side voltage, or the monitored load current.

According to another example embodiment, an apparatus is provided for detecting theft and status of electrical power. The apparatus includes a main circuit breaker, one or more sensors for monitoring the switch state of the main circuit breaker, a voltage monitoring circuit for monitoring the load-side voltage, and a current monitoring circuit for monitoring the load current. The apparatus also includes a controller configured for determining one or more conditions associated with power usage based at least in part on one or more of the monitored switch state, the monitored load-side voltage, or the monitored load current.

Other embodiments and aspects of the invention are described in detail herein and are considered a part of the claimed inventions. Other embodiments and aspects can be understood with reference to the following detailed description, accompanying drawings, and claims.

BRIEF DESCRIPTION OF THE FIGURES

Reference will now be made to the accompanying drawings, tables, and flow diagrams, which are not necessarily drawn to scale, and wherein:

FIG. 3 is an example condition state table, according to an example embodiment of the invention.

DETAILED DESCRIPTION OF THE INVENTION

Embodiments of the invention will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Example embodiments of the invention include a smart circuit breaker for the detection of electrical power theft. Certain example embodiments of the smart circuit breaker may also facilitate the detection of other conditions associated with electrical power delivery including isolated loads, power outages, and/or normal operation.

A person intending to steal electrical power may bypass a power meter in an attempt to allow current to flow undetected into the house wiring. However, according to an example embodiment of the invention, power flow may be detected with the smart circuit breaker when the main circuit breaker circuit is opened or closed. According to an example embodiment, messages indicating one or more conditions associated with the power may be generated by embodiments of the invention based on measurements of current, voltage, and/or the state of the circuit breaker. In an example embodiment, when current is detected flowing into the house wiring while the circuit breaker is opened, a message may be generated indicating possible power theft. In an example embodiment, the smart circuit breaker may transmit or communicate messages to the smart meter or the power company by way of a bi-directional radio frequency transceiver or other communications channel. In an example embodiment, the smart circuit breaker may utilize a low power microcontroller for reading the main circuit breaker switch position. In an example embodiment, the microcontroller may also be utilized to read the voltage and current on the load-side of the main circuit breaker, and to determine the appropriate message to generate.

According to example embodiments of the invention, various hardware components and firmware modules may be utilized for detecting power theft or other conditions associated with power delivery, and will now be described with reference to the accompanying figures.

Figure 1:
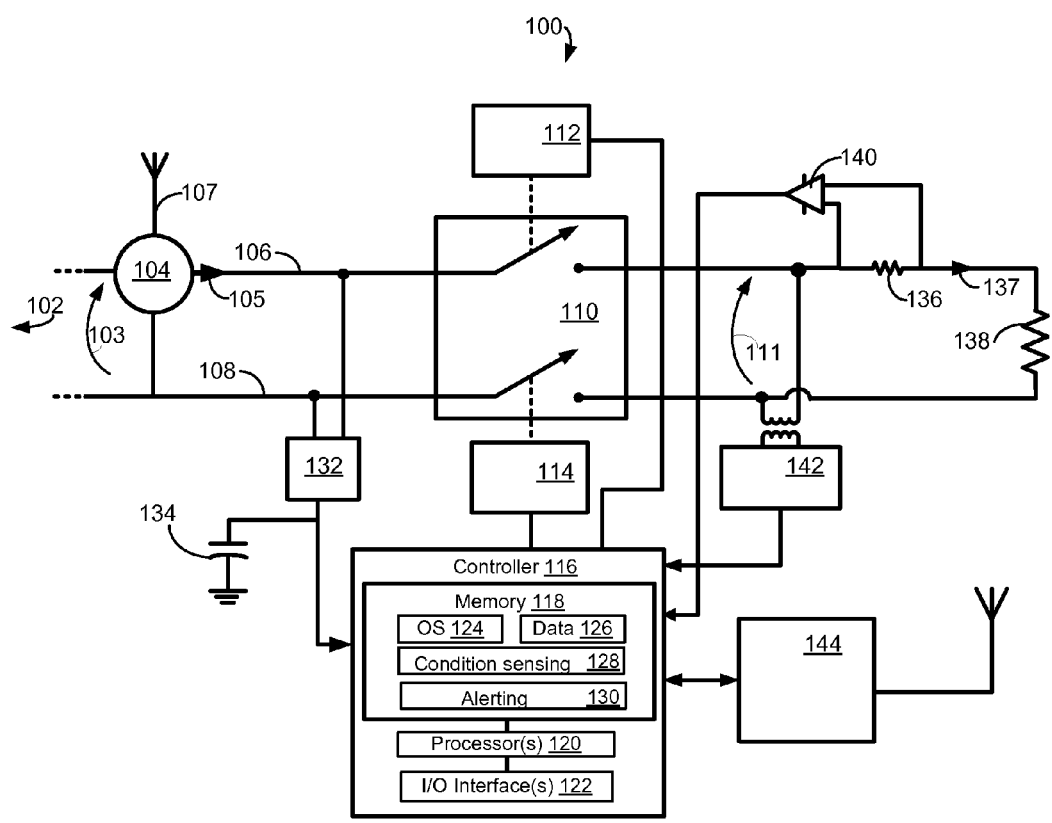
FIG. 1 is a block diagram of an illustrative smart circuit breaker system, according to an example embodiment of the invention.

FIG. 1 is a block diagram of an illustrative smart circuit breaker system 100, according to an example embodiment of the invention.

According to example embodiments of the invention, a utility 102 may provide electrical power for use at a premise. In an example embodiment, a power meter 104 may measure the line voltage 103 and the line current 105 associated with the phase 106 and the neutral 108 conductors to determine the power usage associated with the premise. In an example embodiment, the power meter 104 may include a transmitter 107 for communicating the power usage to the utility, or for communicating with other devices associated with the delivery of power.

According to an example embodiment of the invention, a main circuit breaker 110 may be utilized to control the connection from the utility to the premise. In certain example embodiments, the main circuit breaker may include circuit breaker position sensors 112, 114 for detecting the position of the main circuit breaker 110 contacts (open or closed). In certain example embodiments, the position sensors 112, 114 may be Hall sensors or other proximity sensors. According to another example embodiment, the electrical connection associated with the main circuit breaker 110 may be detected using resistor networks, for example.

According to example embodiments of the invention, a controller 116 may be utilized in conjunction with the smart circuit breaker system 100 to determine conditions associated with the delivery of power, and to provide appropriate messaging. In an example embodiment, the controller 116 may include a memory 118, one or more processors 120, and one or more input/output (I/O) interfaces 122. In an example embodiment, the memory 118 may include an operating system (O/S) 124, data 126, a condition-sensing module 128, and an alerting module 130. In an example embodiment, the operating system 124, data 126, the condition-sensing module 128, and the alerting module 130 may provide application-specific machine-readable code for controlling the functions associated with the controller 116.

According to an example embodiment of the invention, the input/output interfaces 122 may accept measured input from one or more devices associated with the measurement of current, voltage, and/or main breaker position. For example, the circuit breaker position sensors 112, 114 may provide a signal indicative of the sensed position of the main circuit breaker 110 contacts. In an example embodiment, the load-side voltage may be determined by a load-side voltage monitor 142. The load-side voltage monitor 142 may couple with the load side via a transformer or other device for measuring the load-side voltage 111. In an example embodiment, the load-side voltage monitor 142 may also include an alternating current-to-direct current converter for providing a direct current signal to the controller 116 proportional (or indicative) of the load-side alternating current (AC) voltage.

According to example embodiments, a current sensor 136 may be placed in series with the house wiring or load 138 to detect load current 137. According to an example embodiment, the current sensor 136 may be a resistor with a very low resistance value (typically much less than about 1 ohm) to avoid unnecessary I²R heating and losses. In an example embodiment, an instrument amplifier 140 may be utilized to measure the voltage across the current sensor 136. In an example embodiment, the current to the house wiring or load 138 may be determined by the voltage across the current sensor 136 divided by the resistance of the current sensor 136.

According to an example embodiment, the controller 116 may utilize the condition-sensing module 128 and the alerting module 130 to generate appropriate messages based on the resultant measurements associated with the current, voltage, and/or main breaker position. In an example embodiment, the generated messages may be communicated to the power meter 104 or the utility 102 via a communications channel. In an example embodiment, the smart circuit breaker system 100 may include a wired or wireless transceiver 144 for communicating the messages, and/or receiving information.

According to an example embodiment, the controller 116 and other devices associated with the smart circuit breaker system 100 may be powered by a power supply 132, which may receive power from the main power lines 106, 108. In an example embodiment, the power supply 132 may convert the line AC voltage 103 to one or more DC voltages that can be used for operating the controller, microprocessor, and other associated devices. According to an example embodiment, a super capacitor or battery backup 134 may be utilized for providing power to the circuitry, even when there is a power outage.

Figure 2:
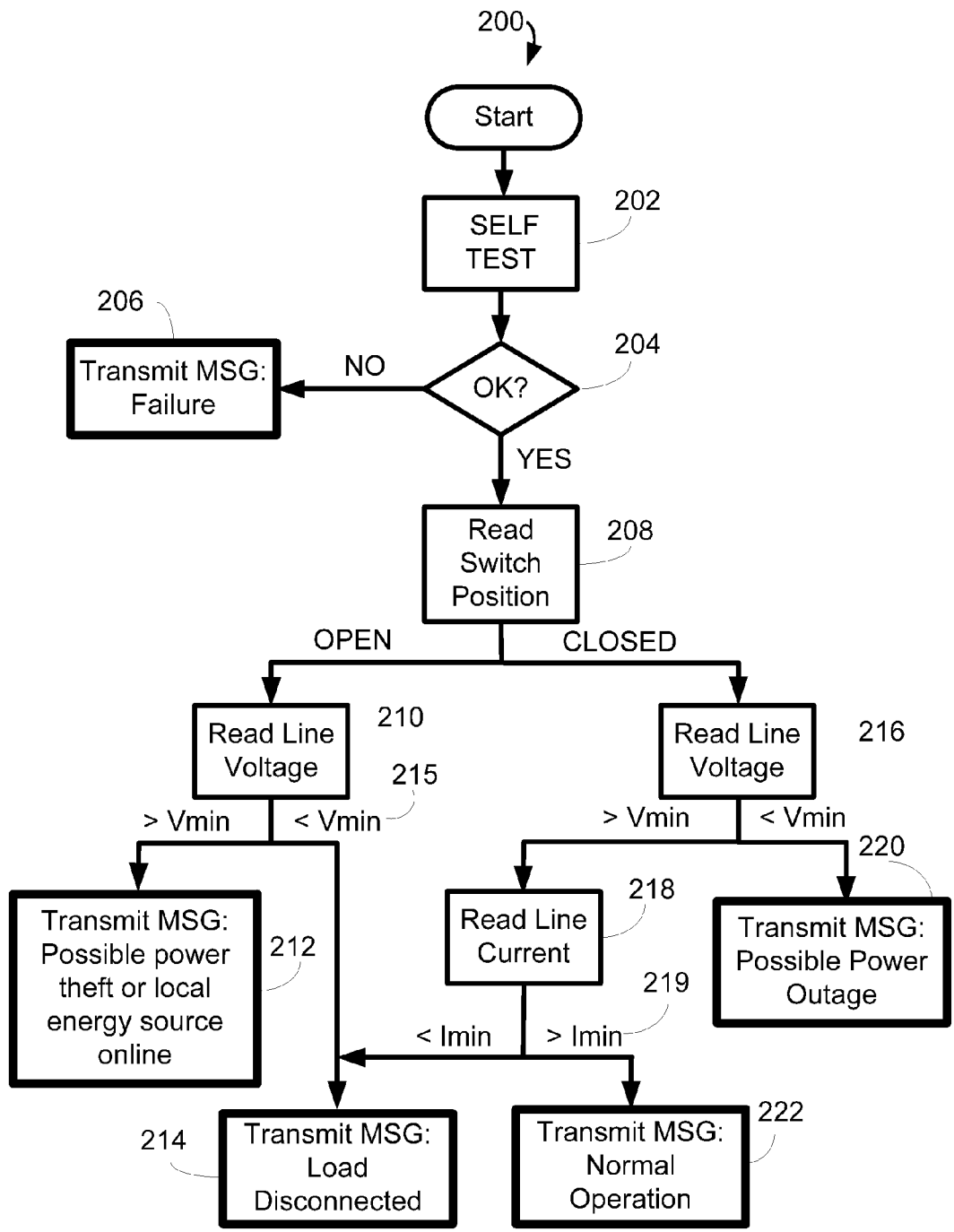
FIG. 2 is flow diagram of an illustrative detection and messaging method, according to an example embodiment of the invention.

FIG. 2 is a flow diagram of an illustrative detection and messaging method 200, according to an example embodiment of the invention. In an example embodiment, a self-test 202 may be performed to determine the status of the smart circuit breaker system (for example, 100 as shown in FIG. 1). According to an example embodiment, the self-test 202 may be utilized to check internal and external values, voltages, signal amplitudes, etc., to determine if there are any problems, or if the system is okay 204. In an example embodiment, an analysis of the results of the self-test 202 may be utilized to either transmit a failure message 206 (if a problem is detected), or to proceed with reading the position of one or more of the circuit breaker switches 208. According to an example embodiment, if the circuit breaker switch is determined to be in a closed position, the detection and messaging method 200 may read the line voltage 216.

In an example embodiment, if the line root mean squared (RMS) voltage is determined to be less than a predetermined value, then a message may be transmitted to indicate a possible power outage 220. On the other hand, if the line voltage is determined to be greater than a predetermined value, then the line current may be read 218. If the line current is greater than a predetermined minimum value 219, then a normal operation message may be transmitted 222. If, on the other hand, the line current is less than a predetermined minimum value, then a message may be transmitted to indicate that the load may be disconnected 214.

In accordance with an example embodiment of the invention, if the circuit breaker switch is read 208 and determined to be open, the line voltage may be read 210. If the line voltage is determined to be less than a predetermined minimum value 215, then a message may be transmitted that the load may be disconnected 214. On the other hand, if the circuit breaker switch is read 208 and determined to be open and the line voltage is determined to be greater than a predetermined minimum value, then a message may be transmitted that there is a possible power theft, or that there is a local energy source online 212 that is providing power.

FIG. 3 depicts an example condition state table 300 and a corresponding key table 302 for determining the conditions associated with the smart circuit breaker. In an example embodiment, a condition 301 may be determined by the evaluation of the three measurements: (1) the circuit breaker position (open or closed); (2) the load current (above or below a predetermined threshold); and (3) the load voltage (above or below a predetermined threshold). For example, if the circuit breaker is open (0) and the load current is read to be less than a predetermined amount (0), but the load voltage is greater than a predetermined amount (1), then a likely condition detected by the smart circuit breaker is theft of renewable power (or that a local source of power is providing the measured load voltage). Other conditions 301 related to the use and/or status of the electrical power may be determined by the condition state table 300.

Figure 4:
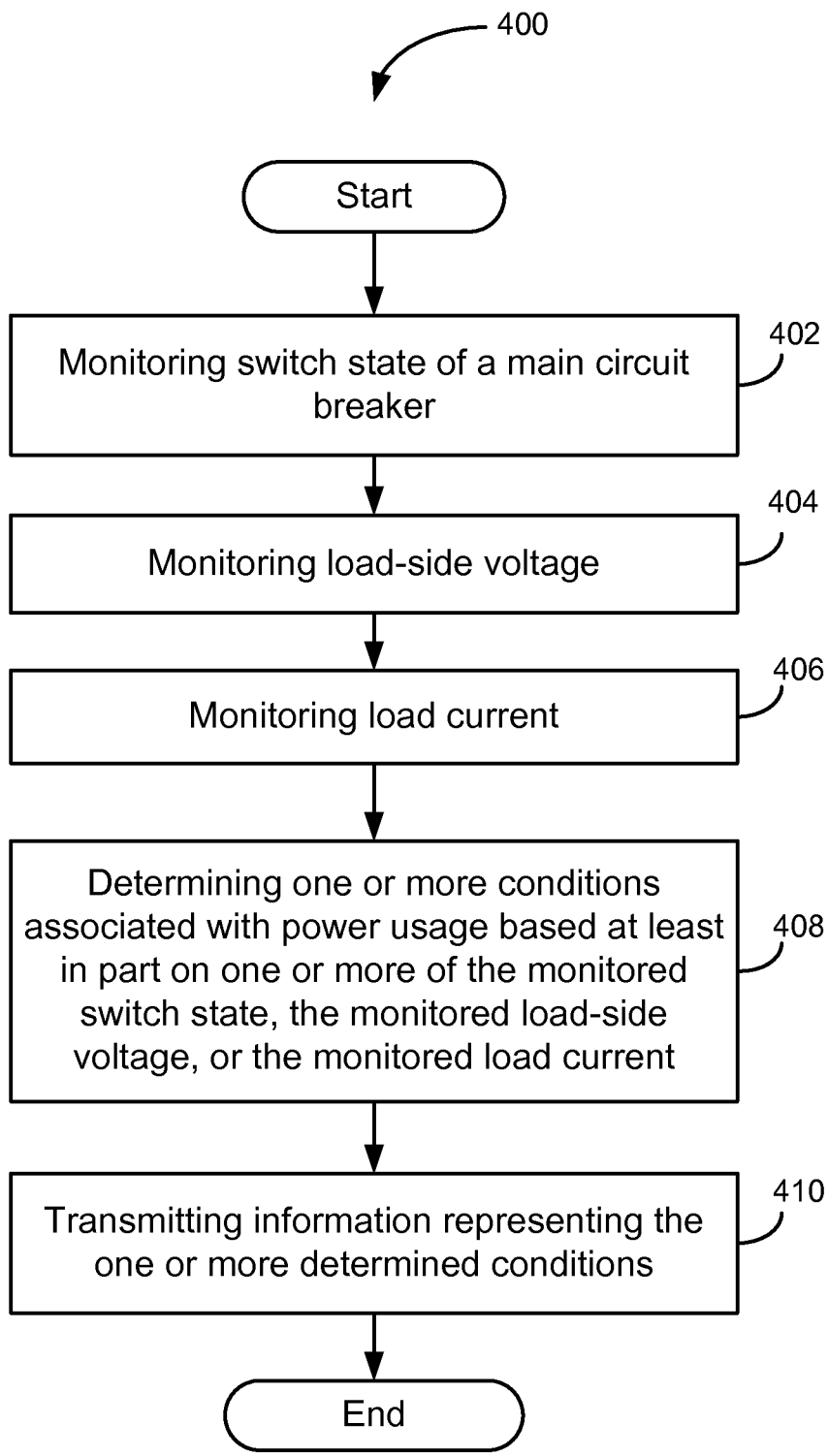
FIG. 4 is flow diagram of an illustrative method, according to an example embodiment of the invention.

An example method 400 for detecting theft and status of electrical power will now be described with reference to the flow diagram of FIG. 4. The method 400 starts in block 402 and according to an example embodiment of the invention, includes monitoring the switch state of a main circuit breaker.

In block 404, and according to an example embodiment, the method 400 includes monitoring load-side voltage. In block 406, and according to an example embodiment, the method 400 includes monitoring load current. In block 408, and according to an example embodiment, the method 400 includes determining one or more conditions associated with power usage based at least in part on one or more of the monitored switch state, the monitored load-side voltage, or the monitored load current. In block 410, and according to an example embodiment, the method 400 includes transmitting information representing the one or more determined conditions. The method ends after block 410.

In accordance with certain example embodiments of the invention, determining one or more conditions associated with power usage may be based on a comparison of the monitored load-side voltage to a minimum threshold voltage value. In another example embodiment, determining the one or more conditions may be based on comparing the monitored load current to a minimum threshold current value. In an example embodiment, determining the one or more conditions may include determining one or more of: possible power theft; possible local energy source online; possible power outage; load disconnected; or normal operation.

In an example embodiment, detecting theft and status of electrical power may include receiving line voltage and line current information from one or more power meters. According to an example embodiment, verifying the one or more conditions associated with power usage may be based at least in part on the received line voltage and line current information. According to an example embodiment, monitoring the switch state of the main circuit breaker may include monitoring one or more position sensors.

According to example embodiments of the invention, a system or apparatus may be utilized for detecting theft and status of electrical power. In an example embodiment, the system or apparatus may include a power meter. In an example embodiment, the system or apparatus may include a main circuit breaker. In an example embodiment, the system or apparatus may include one or more sensors for monitoring the switch state of the main circuit breaker. In an example embodiment, the system or apparatus may include a voltage monitoring circuit for monitoring load-side voltage. In an example embodiment, the system or apparatus may include a current monitoring circuit for monitoring load current. In an example embodiment, the system or apparatus may include a controller configured for determining one or more conditions associated with power usage based at least in part on one or more of the monitored switch state, the monitored load-side voltage, or the monitored load current.

In an example embodiment, the system or apparatus may include a transceiver in communication with the controller, wherein the transceiver is operable to transmit information representing the one or more determined conditions. In an example embodiment, the controller is further configured for determining the one or more conditions based at least in part on comparing the monitored load-side voltage to a minimum threshold voltage value. In an example embodiment, the controller is further configured for determining the one or more conditions based at least in part on comparing the monitored load current to a minimum threshold current value.

According to example embodiments, certain technical effects can be provided, such as creating certain systems, methods, and apparatus that allow detection of theft from a power utility. Example embodiments of the invention can provide the further technical effects of providing systems, methods, and apparatus for determining one or more states associated with power usage, including possible power theft, a possible local energy source online, a possible power outage, a load disconnected, or normal operation.

In example embodiments of the invention, the smart circuit breaker system 100 may include any number of hardware and/or software applications that are executed to facilitate any of the operations.

In example embodiments, one or more I/O interfaces may facilitate communication between the smart circuit breaker system 100 and one or more input/output devices. For example, a universal serial bus port, a serial port, a disk drive, a CD-ROM drive, and/or one or more user interface devices, such as a display, keyboard, keypad, mouse, control panel, touch screen display, microphone, etc., may facilitate user interaction with the smart circuit breaker system 100. The one or more I/O interfaces may be utilized to receive or collect data and/or user instructions from a wide variety of input devices. Received data may be processed by one or more computer processors as desired in various embodiments of the invention and/or stored in one or more memory devices.

One or more network interfaces may facilitate connection of the smart circuit breaker system 100 inputs and outputs to one or more suitable networks and/or connections; for example, the connections that facilitate communication with any number of sensors associated with the system. The one or more network interfaces may further facilitate connection to one or more suitable networks; for example, a local area network, a wide area network, the Internet, a cellular network, a radio frequency network, a Bluetooth™ (owned by Telefonaktiebolaget LM Ericsson) enabled network, a Wi-Fi™ (owned by Wi-Fi Alliance) enabled network, a satellite-based network, any wired network, any wireless network, etc., for communication with external devices and/or systems.

As desired, embodiments of the invention may include the smart circuit breaker system 100 with more or less of the components illustrated in FIG. 1.

Certain embodiments of the invention are described above with reference to block and flow diagrams of systems, methods, apparatuses, and/or computer program products according to example embodiments of the invention. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, or may not necessarily need to be performed at all, according to some embodiments of the invention.

These computer-executable program instructions may be loaded onto a general-purpose computer, a special-purpose computer, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks. As an example, embodiments of the invention may provide for a computer program product, comprising a computer-usable medium having a computer-readable program code or program instructions embodied therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special-purpose hardware and computer instructions.

While certain embodiments of the invention have been described in connection with what is presently considered to be the most practical and various embodiments, it is to be understood that the invention is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain embodiments of the invention, including the best mode, and also to enable any person skilled in the art to practice certain embodiments of the invention, including making and using any devices or systems and performing any incorporated methods. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The claimed invention is:

1. A method for detecting theft and status of electrical power, the method comprising:
    monitoring, by one or more sensors, a switch state of a main circuit breaker;
    monitoring, by a voltage monitoring circuit, a load-side voltage;
    monitoring, by a current monitoring circuit, a load current;
    detecting, by a controller, the theft and status of electrical power, wherein the theft and status of electrical power includes the theft of electrical power, a load disconnected status, a normal operation status, and a power outage status, and the theft and status of electrical power is detected based at least in part on occurrence of the following events:
        the theft of electrical power is detected based on occurrence of the following events: the switch state of the main circuit breaker is open, and the load-side voltage is above a predetermined threshold;
        the load disconnected status is detected on occurrence of the following events:
        the switch state of the main circuit breaker is open, and the load-side voltage is below a predetermined threshold; or
        the switch state of the main circuit breaker is closed, the load-side voltage is above the predetermined threshold, and the load current is less than a predetermined amount;
        the normal operation status is detected based on occurrence of the following events: the switch state of the main circuit breaker is closed, the load-side voltage is above the predetermined threshold, and the load current is above the predetermined amount;
        the power outage status is detected based on occurrence of the following events: the switch state of the main circuit breaker is closed, and the load-side voltage is below the predetermined threshold; and
    transmitting, by an alerting module, information representing the detection of the theft and status of electrical power.

2. The method of claim 1, wherein detecting the theft of electrical power comprises comparing the monitored load-side voltage to a minimum threshold voltage value.

3. The method of claim 1, wherein detecting the status of electrical power comprises comparing the monitored load current to a minimum threshold current value.

4. The method of claim 1, further comprising receiving line voltage and line current information from one or more power meters.

5. The method of claim 4, further comprising verifying one or more conditions associated with power usage based at least in part on the received line voltage and line current information.

6. The method of claim 1, wherein monitoring the switch state of the main circuit breaker comprises monitoring one or more position sensors.

7. A system for detecting theft and status of electrical power, the system comprising:
    a power meter;
    a main circuit breaker;
    one or more sensors for monitoring a switch state of the main circuit breaker;
    a voltage monitoring circuit for monitoring a load-side voltage;
    a current monitoring circuit for monitoring a load current; and
    a controller configured for detecting the theft and status of electrical power, wherein the theft and status of electrical power includes the theft of electrical power, a load disconnected status, a normal operation status, and a power outage status, and the theft and status of electrical power is detected based at least in part on occurrence of the following events:
        the theft of electrical power is detected based on occurrence of the following events: the switch state of the main circuit breaker is open, and the load-side voltage is above a predetermined threshold;
        the load disconnected status is detected on occurrence of the following events:
        the switch state of the main circuit breaker is open, and the load-side voltage is below a predetermined threshold; or
        the switch state of the main circuit breaker is closed, the load-side voltage is above the predetermined threshold, and the load current is less than a predetermined amount;
        the normal operation status is detected based on occurrence of the following events: the switch state of the main circuit breaker is closed, the load-side voltage is above the predetermined threshold, and the load current is above the predetermined amount;

the power outage status is detected based on occurrence of the following events: the switch state of the main circuit breaker is closed, and the load-side voltage is below the predetermined threshold.

8. The system of claim 7, further comprising a transceiver in communication with the controller, wherein the transceiver is operable to transmit information representing the detection of the theft and status of electrical power.

9. The system of claim 7, wherein the controller is further configured for detecting the theft of electrical power based at least in part on comparing the monitored load-side voltage to a minimum threshold voltage value.

10. The system of claim 7, wherein the controller is further configured for detecting the status of electrical power based at least in part on comparing the monitored load current to a minimum threshold current value.

11. The system of claim 7, wherein the controller is further configured to receive line voltage and line current information from the one or more power meters.

12. The system of claim 11, wherein the controller is further configured to verify one or more conditions associated with power usage based at least in part on the received line voltage and line current information.

13. An apparatus for detecting theft and status of electrical power, the apparatus comprising:
   a main circuit breaker;
   one or more sensors for monitoring a switch state of the main circuit breaker;
   a voltage monitoring circuit for monitoring a load-side voltage;
   a current monitoring circuit for monitoring a load current; and
   a controller configured for detecting the theft and status of electrical power, wherein the theft and status of electrical power includes the theft of electrical power, a load disconnected status, a normal operation status, and a power outage status, and the theft and status of electrical power is detected based at least in part on occurrence of the following events:
      the theft of electrical power is detected based on occurrence of the following events: the switch state of the main circuit breaker is open, and the load-side voltage is above a predetermined threshold;
      the load disconnected status is detected on occurrence of the following events:
      the switch state of the main circuit breaker is open, and the load-side voltage is below a predetermined threshold; or
      the switch state of the main circuit breaker is closed, the load-side voltage is above the predetermined threshold, and the load current is less than a predetermined amount;
      the normal operation status is detected based on occurrence of the following events: the switch state of the main circuit breaker is closed, the load-side voltage is above the predetermined threshold, and the load current is above the predetermined amount;
      the power outage status is detected based on occurrence of the following events: the switch state of the main circuit breaker is closed, and the load-side voltage is below the predetermined threshold.

14. The apparatus of claim 13, further comprising a transceiver in communication with the controller, wherein the transceiver is operable to transmit information representing the detection of the theft and status of electrical power.

15. The apparatus of claim 13, wherein the controller is further configured for detecting the theft of electrical power based at least in part on comparing the monitored load-side voltage to a minimum threshold voltage value.

16. The apparatus of claim 13, wherein the controller is further configured for detecting the status of electrical power based at least in part on comparing the monitored load current to a minimum threshold current value.

17. The apparatus of claim 13, wherein the controller is further configured to receive line voltage and line current information from one or more power meters, and wherein the controller is further configured to verify one or more conditions associated with power usage based at least in part on the received line voltage and line current information.

* * * * *